United States Patent
Manning et al.

(10) Patent No.: US 6,301,164 B1
(45) Date of Patent: Oct. 9, 2001

(54) ANTIFUSE METHOD TO REPAIR COLUMNS IN A PREFETCHED OUTPUT MEMORY ARCHITECTURE

(75) Inventors: Troy A. Manning, Meridian; Chris G. Martin, Boise; Shubneesh Batra, Boise; Donald M. Morgan, Boise, all of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/648,921

(22) Filed: Aug. 25, 2000

(51) Int. Cl.[7] .................................................. G11C 7/00
(52) U.S. Cl. ................. 365/200; 365/225.7; 365/230.02; 365/230.08
(58) Field of Search ............................... 365/200, 225.7, 365/230.02, 189.02, 189.05, 189.12, 230.08

(56) References Cited

U.S. PATENT DOCUMENTS 5,642,316 * 6/1997 Tran et al. ............................ 365/200
5,732,030 * 3/1998 Dorney ................................. 365/200
5,798,974 * 8/1998 Yamagata ............................. 365/200
6,097,644 * 8/2000 Shirley ................................. 365/200
6,154,398 * 11/2000 Cutter et al. ........................ 365/200

* cited by examiner

*Primary Examiner*—Son T. Dinh
(74) *Attorney, Agent, or Firm*—Schwegman, Lundberg, Woessner & Kluth, P.A.

(57) ABSTRACT

A memory device having a first set of programmable elements programmed to store an address of a column having a bad memory cell, and a second set of programmable elements programmed to store a segment-in-time (SIT) of the bad memory cell, the SIT of the bad memory cell indicating a relative position of the bad memory cell within a plurality of memory cells being accessed in a memory access. The SIT allows the memory device to selectively repair a bad memory cell within a column of memory cells accessed during a memory operation.

30 Claims, 11 Drawing Sheets

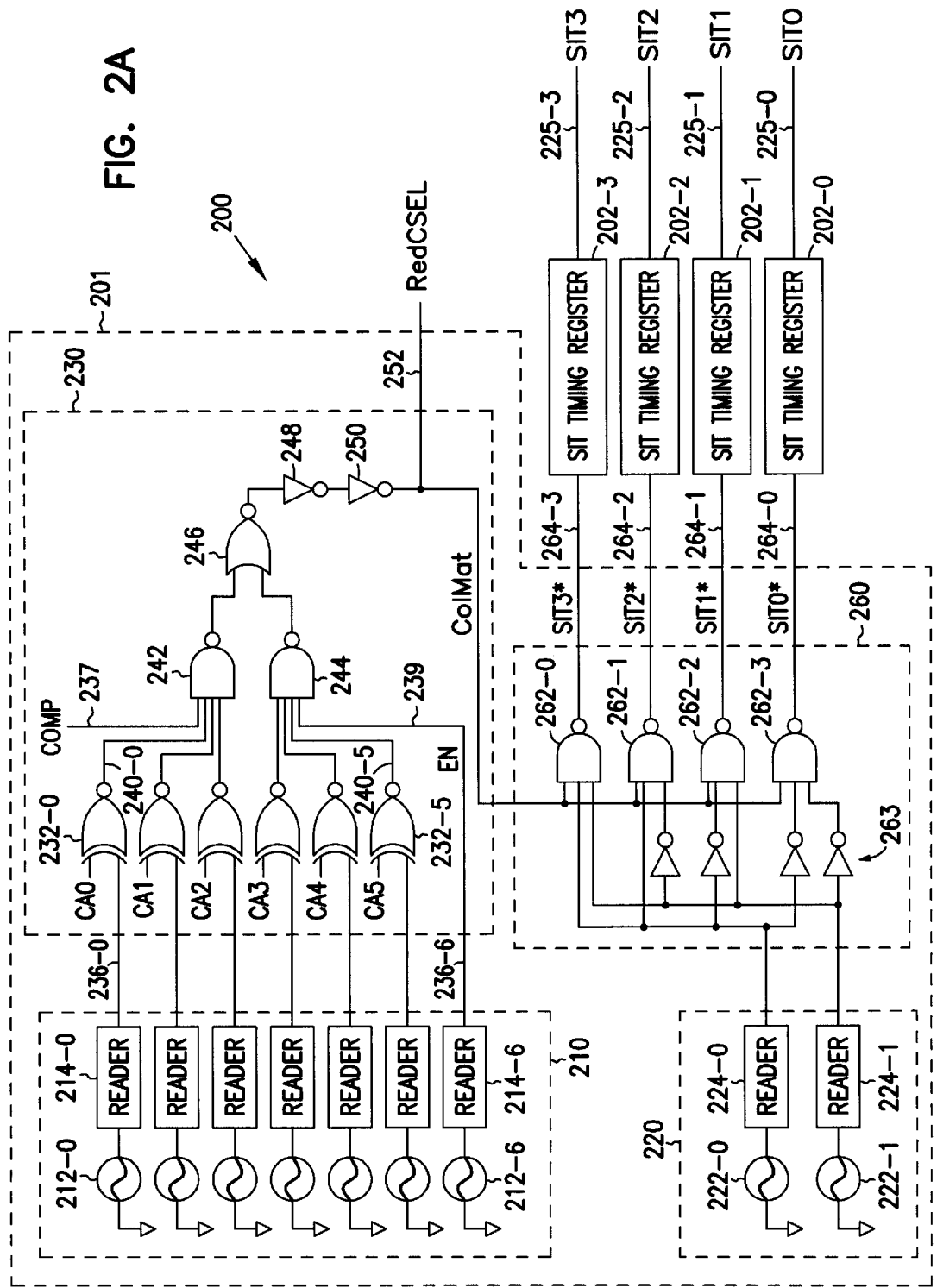

ANTIFUSE METHOD TO REPAIR COLUMNS IN A PREFETCHED OUTPUT MEMORY ARCHITECTURE

TECHNICAL FIELD OF THE INVENTION

The present invention relates generally to semiconductor memory devices, and in particular to repairing columns in a memory device.

BACKGROUND OF THE INVENTION

Semiconductor memory devices such as dynamic random access memory (DRAM) devices are widely used to store data in computers and electronic products. A DRAM device typically has a large number of memory cells to store the data. The memory cells are typically arranged in rows and columns.

To ensure the reliability of the memory device, each of the memory cells is tested to determine its performance or to detect a defective cell. Typically, to repair a column having a defective cell, the entire column must be replaced by a spare column or redundant column within the memory device. The redundant column has the same number of cells as that of the column having the defective cell. This method for the repair of a column of a memory device is not cost effective or efficient, since not only the defective cell with the column is replaced but good cells within the same column are also replaced. Also, providing an entire redundant column consumes valuable space in the memory device.

Thus, there is a need for a better method to repair a column having a defective cell.

SUMMARY OF THE INVENTION

The problems associated with repairing column having a defective memory cell and other problems are addressed by the present invention and will be understood by reading the following disclosure. An antifuse method to repair a column of a memory device is provided. The method more efficiently repairs a column of a memory device than previous methods.

In one embodiment, an integrated circuit is provided. The integrated circuit includes a first set of programmable elements programmed to store an address of a column having a bad memory cell, and a second set of programmable elements programmed to store a segment-in-time (SIT) of the bad memory cell, the SIT of the bad memory cell indicating a relative position of the bad memory cell within a plurality of memory cells being accessed in a memory access. The SIT allows the memory device to selectively repair a bad memory cell within a column of memory cells accessed during a memory operation.

In another embodiment, a method of repairing a column of a memory device having a bad cell is provided. The method includes programming a first set of programmable elements to store an address of a column having a bad cell. The method also includes programming a second set of programmable elements to store a segment-in-time (SIT) information of the bad cell indicating a relative position of the bad memory cell within a plurality of memory cells being accessed in a previous memory access. The method further includes decoding the SIT information to generate an SIT signal to replace the bad memory.

BRIEF DESCRIPTION OF THE DRAWINGS

FIG. 2A is a schematic diagram of a redundancy address match circuit of the memory device of FIG. 1.

DETAILED DESCRIPTION OF THE INVENTION

The following detailed description refers to the accompanying drawings, which form a part hereof, and shows by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
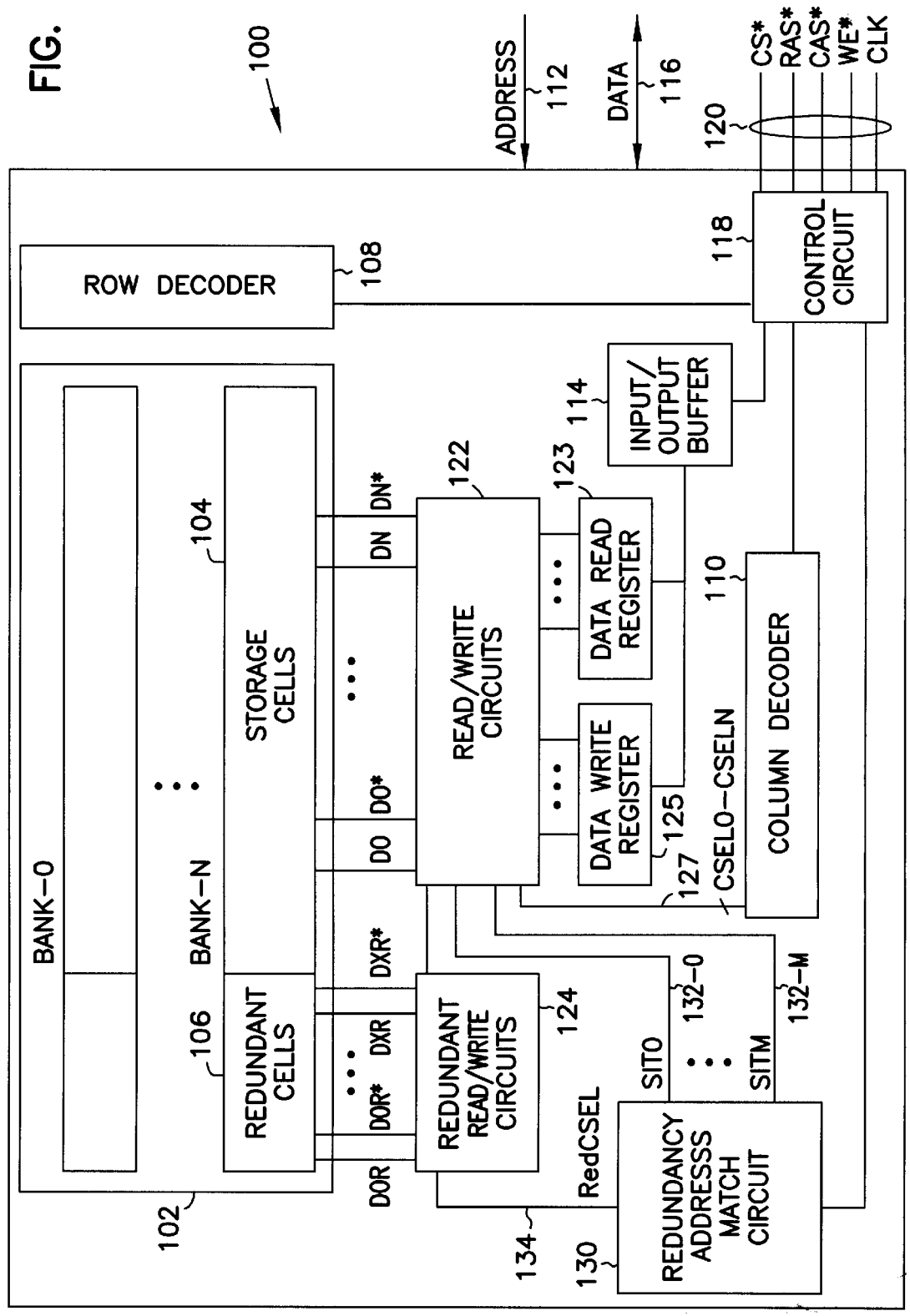
FIG. 1 is a block diagram of a memory device according to the invention.

FIG. 1 is a block diagram of one embodiment of a memory device 100 according to the invention. Memory device 100 includes, by way of example and not limitation, a synchronous dynamic random access memory device (SDRAM). As shown in FIG. 1, memory device 100 includes a memory array 102. Memory array 102 typically includes dynamic random access memory (DRAM) devices, which include one or more memory banks, indicated by BANK 0–N. Each of the memory banks BANK 0–N includes a plurality of storage cells 104 and redundant cells 106 arranged in rows and columns. Row decode 108 and column decode 110 access the rows and columns of memory array 102 in response to an address provided on address bus 112 (ADDRESS). An input/output buffer 114 is connected to a data bus 116 (DATA) for bi-directional data communication with memory array 102. A memory controller 118 controls data communication between the memory 100 and external devices by responding to an input clock signal (CLK) and control signals provided on control lines 120 (CONTROL). The control signals include, but are not limited to, Chip Select (CS*), Row Access Strobe (RAS*), Column Access Strobe (CAS*), and Write Enable (WE*).

Memory device 100 further includes a read/write circuit 122 connected to the storage cells via a plurality of paired digit lines D0–D0* to DN–DN* and connected to column decoder 110 via column select lines 127. Read/write circuit 122 is also connected to input/output circuit 114 through a data read register 123 and a data write register 125. A redundant read/write circuit 124 is provided which is connected to the redundant cells via a plurality of paired redundant digit lines D0R–D0R* to DXR–DXR*. In addition, memory device 100 includes a redundancy address match circuit 130, which has a plurality of outputs or select lines 132 0–N connected to read/write circuit 122 and a redundant column select line 134 connected to redundant read/write circuit 124. Select lines 132 0–N provide a plurality of bit identifying signals or segrnent-in-time (SIT) signals SIT 0–M. A SIT signal indicates a SIT information of a bad bit within a column of the storage cells. Redundant column select line 134 provides a redundant column select line signal RedCSEL and column select lines 127 provide column select signals CSEL0–CSELN.

In a read operation, control circuit 118 decodes a combination of control signals on line 120 and present address on address bus 112 to initiate the read operation. One of column select lines 127 activates a certain CSEL in response to address 112 to access a column of storage cells 104. Accessed data or bits of the storage cells are transmitted to read/write circuit 122 via digit lines D0–DN*. At the same time, control circuit 118 activates the redundancy address match circuit to compare the present column address with a programmed column address having a bad storage cell. If there is no match between the present column address and the programmed column address, the data of storage cells are output to data read register 123 and subsequently to input/output buffer 114 and data bus 116. However, a match between the present column address indicates that the column being accessed has a bad bit. In this case, redundancy address match circuit 130 activates the RedCSEL signal to connect one of the redundant cells through one of the redundant digit lines D0R–DXR to redundant read/write circuit 124. Redundancy address match circuit 130 also activates one of select lines 132 0–M SIT 0–M signals. The SIT signal causes read/write circuit 122 to selectively replace the bad bit of the bad storage cell in a column with a redundant bit of the redundant cell. The selection of the bad bit is based on the SIT information indicated by the SIT signal. With this novel method, not all of the bits of the accessed column are replaced but only a bad bit within a column is replaced by a redundant bit.

In a write operation, data is written into storage cells or redundant cells in an opposite path. Data or bits at data bus 116 are transmitted to input/output buffer 114 and then to data write register 125. From the data write register, the data are transmitted to read/write circuit 122. At this time if there is no match between the present column address and the programmed address, then the data are transmitted to digit lines D0–5DN* and into storage cells 104. However, if there is a match between the present column address and the programmed address, then redundant circuit activates RedCSEL on line 134 and one of the SIT 0–M signals on lines 132 0–M. The RedCSEL signal connects one of the redundant digit lines D0R–DXR to redundant read/write circuit 124. One of the SIT 0–M signals causes read/write circuit 122 to reroute one of the bits to redundant read/write circuit 124. The bit is subsequently written into one of the redundant cells 106.

FIG. 2A is a schematic diagram of a redundancy address match circuit 200 of memory device 100 FIG. 1. Redundancy address match circuit 200 includes a fuse logic circuit 201 connected to a plurality of SIT timing registers 202 0–3 through a plurality of lines 264 0–3, which provides signals SIT0*–SIT3*. SIT timing registers 202 0–3 receives signals SIT0*–SIT3* and provides signals SIT0–SIT3 on lines 225 0–3. Fuse logic circuit 201 includes a first set or group of redundant elements 210, a second set or group of redundant elements 220. First set of redundant elements 210 includes a plurality of programmable elements 212 0–6 and programmable element readers 214 0–6. Second set of redundant elements 220 includes a plurality of programmable elements 222 0–1 and programmable element readers 224 0–1. Second set redundant elements 220 are programmed or configured to store a relative position of a bad storage cell or bad bit in relation to positions of a plurality of storage cells or bits as determined in previous testing. That is, in a previous memory access, for example during a test, a serial position or a segment-in-time (SIT) of a bad bit within M bits was identified. For the purpose of illustrating the present invention, M is 4. Thus the SIT of the bad bit can be in any of the four serial positions or any of the four SITs. Therefore two redundant elements are needed to record or program one out of four possible binary combinations of SIT information of 4 bits. The programmable elements of both sets can be fuses or antifuses or any other elements, which can be programmed or configured to record a predetermined pattern or combination of information or data. Terms such as configure, configuring and configured or program, programming and programmed are used interchangeably in the description of the invention. These terms also include the process of blowing or not blowing a fuse or an anti-fuse or other programmable elements. Furthermore, terms such as data, bit, data bit or bit of data describe the same subject, which is the information read from or written into a memory cell.

Redundancy address match circuit 200 further includes a compare circuit 230 connected to a first set of redundant elements 210, and a decode circuit 260 connected to a second set of redundant elements 220. Compare circuit 230 includes a plurality of Exclusive NOR (XNOR) gates 232 0–5, which have inputs connected to outputs of readers 214-0 to 214-5 via lines 236-0 to 236-5 and column address lines CA0–CA5. XNOR gates have outputs 240 0–5 connected to inputs of NAND gates 242 and 244. NAND gate 242 has an input line 237 to receive a compare timing signal COMP. NAND gate 244 has an input line 239 to receive a compare enable signal EN. The output of NAND gates 242 and 244 are connected to inputs of a NOR gate 246. Output of NOR gate 246 is connected to a node 252 to provide, through inverters 248 and 250, a column match signal ColMat which is also a redundant column select signal RedCSEL. Decode circuit 260 includes a plurality of NAND gates 262 0–3 having inputs connected to column match node 252. NAND gates 262-0 to 262-3 are connected to inverter circuit 263 and outputs of programmable element readers 224 0–1 to decode a combination of second set of redundant elements 220. Decode circuit 260 has outputs connected to nodes 264 0–3.

Figure 2B:
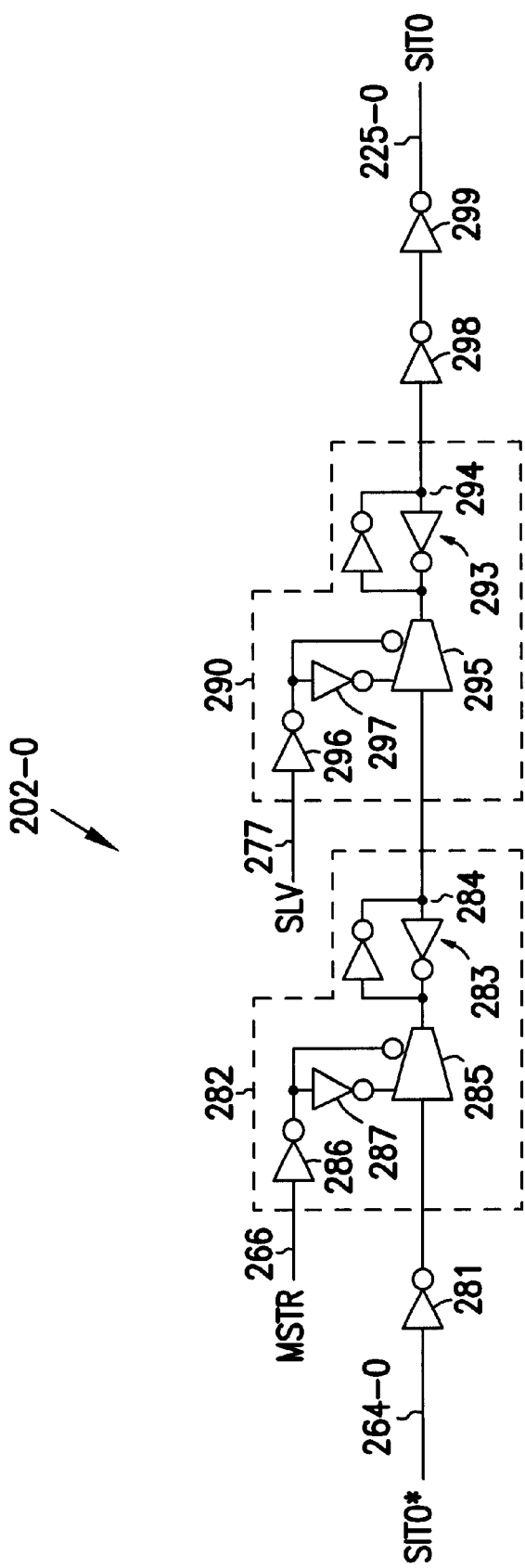
FIG. 2B is a schematic diagram of a timing register of the redundancy address match circuit of FIG. 2A.

FIG. 2B is a schematic diagram of a SIT timing registers 202-0 of FIG. 2A. SIT timing register 202-0 includes a master latch 282 and a slave latch 290. Master latch 282 has a latch 283 to hold data at a master node or first node 284. Data is transmitted to latch 283 through a transmission gate 285, which receives a SIT information signal from node 264-0 through an inverter 281. The passage through transmission gate 285 is controlled by a master signal MSTR at a node 266 through inverters 286 and 287. In a similar arrangement, slave latch 290 has a latch 293 to hold data at slave node or second node 294. Data is transmitted to latch 293 by a transmission gate 295. The passage through transmission gate 295 is controlled by a slave signal SLV at a node 277 through inverters 296 and 297. Transmission gate 295 is connected to master latch 282 at master node 284.

Slave node 294 is connected to output 225-0 through inverters 298 and 299.

During a read operation, control circuit 118 validates control signals on lines 120 and column address CA0–CA5 provided on address bus 112 (FIG. 1) and enables compare circuit 230 (FIG. 2A) to compare address CA0–CA5 with the programmed address of first set of redundant elements 210. Meanwhile, decode circuit 260 decodes a combination of programmable elements 222 0–1 of second set of redundant elements 220. If there is no match between address CA0–CA5 and programmed address, signal ColMat or RedCSEL at node 252 will have a low signal level. A low signal level ColMat causes NAND gates 262 0–3 to have a high signal level at outputs 264 0–3 which causes SIT0–SIT3 to have a low signal level. When SIT0–SIT3 are at a low level. redundancy address match circuit does not affect the operation of memory device 100 and redundant cells are not utilized. In the case when there is a match between address CA0–CA5 and programmed address, signal ColMat at node 252 will have a high signal level. A high signal level ColMat enables NAND gates 262 0–3 to produce a low signal level in one of the signal SIT 0*–3*, which transmits the SIT information of the bad bit to one of the corresponding SIT timing registers 202 0–3.

SIT timing register operates to adjust the timing of the SIT information to ensure that it is properly fit in the timing operation of memory 100 during the read operation. In a read operation, the SIT information is only valid as long as the present address is valid. As soon as the address becomes invalid, the SIT information disappears before read/write circuit 122 is ready to receive data from digit lines D0–DN*. Therefore, during the time when the address is valid and while the SIT is present, signal MSTR activates master latch 282 by turning on transmission gate 285 to trap the SIT information at master node 284. At a predetermined time, when read/write circuit 122 is ready, SLV signal activates slave latch 290 by turning on transmission gate 295 allowing SIT information at master node 284 to pass through the gate to slave node 294. The SIT information at slave node 294 is transmitted to select line 225-0 to activate signal SIT0. In FIG. 1, SIT0 causes read/write circuit to reroute the normal path of a bad bit and replace it with a route of a replacement bit or redundant bit.

Figure 3:
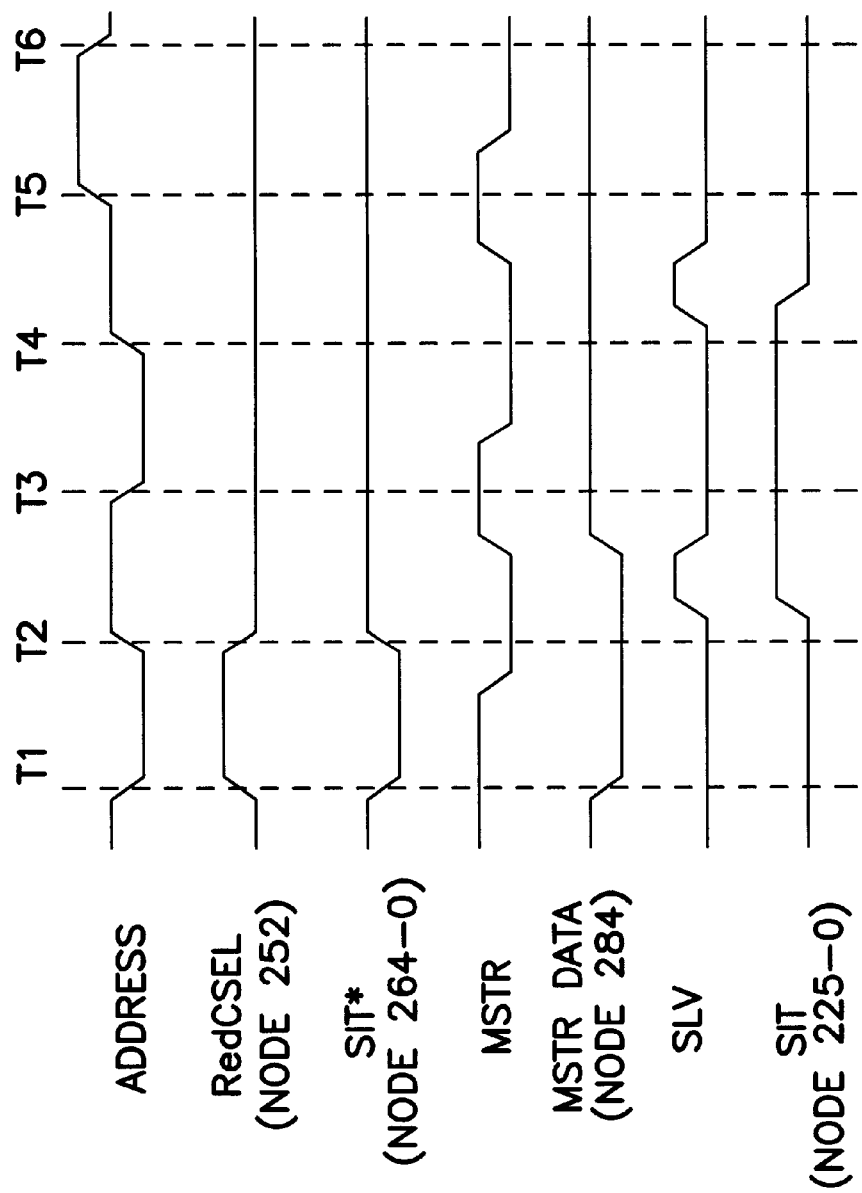
FIG. 3 is timing diagram of the redundancy address match circuit of FIG. 2A during a memory operation.

FIG. 3 is a timing diagram of redundancy address match circuit 200 of FIG. 2 during the read operation. In the Figure, ADDRESS signal presents the column address of storage cells being accessed. The address is only valid for some part of each operation cycle. For instance the address is valid between time T1 and T2, T3 and T4, and T5 and T6. When the address is valid during time T1 and T2, compare circuit 230 compares the present address CA0–CA-5 with the programmed address programmed in first set of redundant elements 210. If there is a match, compare circuit forces a high level signal at node 252. This is indicated in FIG. 3 by RedCSEL signal being at a high signal level signal between time T1 and T2. High signal level at node 252 enables NAND gates 262 0–3 to output a low level signal on one of the output 264 0–3 to activate one of the SIT0*–SIT3* signals indicating a SIT information programmed in second set of redundant element 210. For the purpose of illustrating the present invention, it is assumed that the SIT information programmed is 0. Thus SIT0* at node 264-0 is activated and has a low signal level. This is indicated by SIT0* signal in FIG. 3 between time T1 and T2. While it is still valid or present, the SIT information is trapped by master latch 282 by MSTR signal. At time T1, the MSTR signal is at a high signal level to let the SIT information enter the latch and transitions to a low level signal before the SIT0 and the ADDRESS transition to a high signal level or are invalid at time T2. FIG. 3 shows that data or SIT information represented MSTR DATA signal is unchanged while MSTR signal is low. Before time T2, SLV signal is at a low level signal, thus transmission gate 295 is not on, therefore the SIT information is held at master node 284. At a predetermined time between time T2 and T3, SLV signal transitions to a high signal level. This activates SIT0 signal at node 225-0 causing it to transition to a high signal, which causes read/write circuit 122 to replace a bad bit with a redundant bit from redundant read/write circuit 124.

Figure 4:
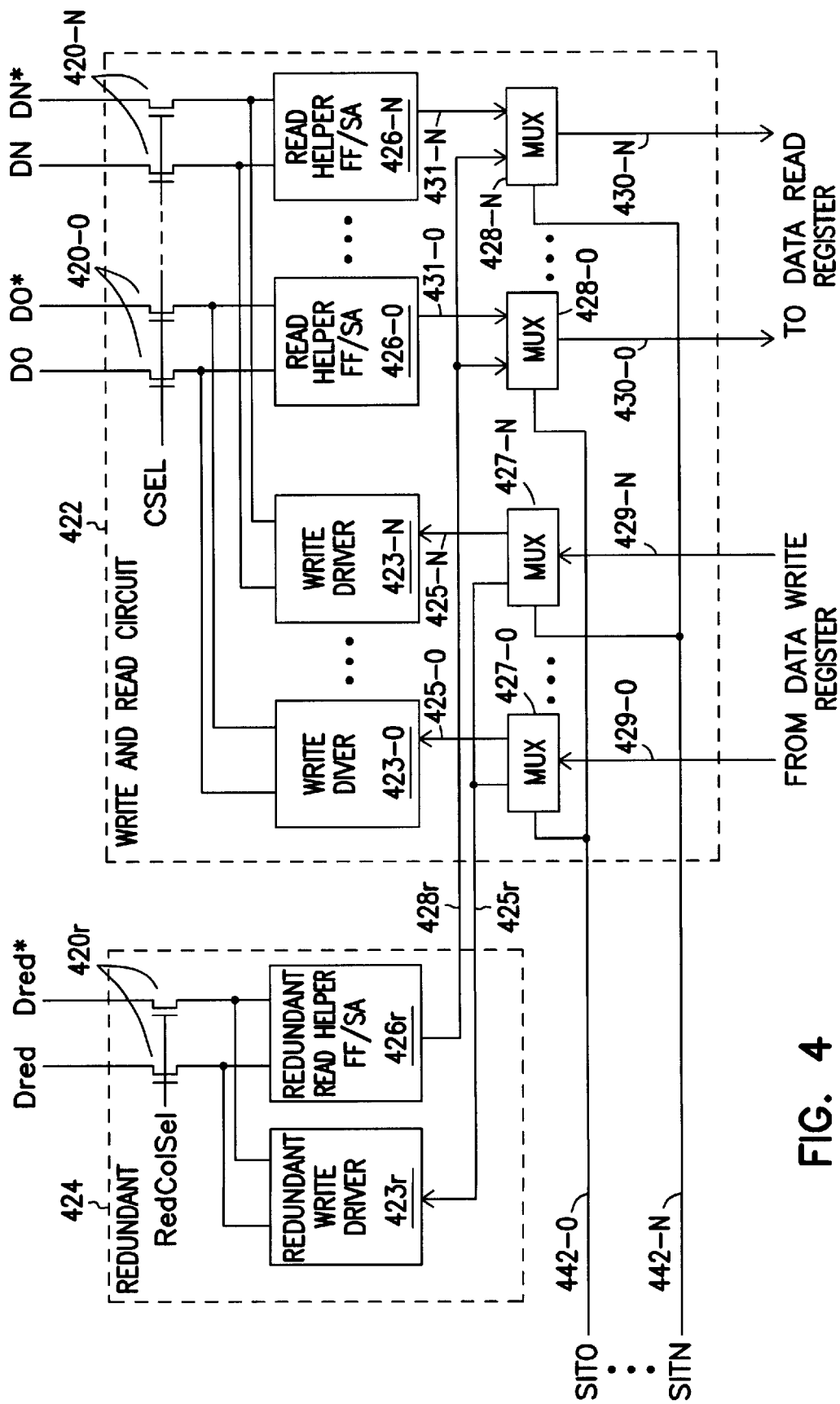
FIG. 4 is a block diagram of a read/write circuit and a redundant read/write circuit of the memory device of FIG. 1.

FIG. 4 is a block diagram of a read/write circuit 422 and a redundant read/write circuit 424 of the memory device of FIG. 1. Read/write circuit 422 includes a plurality of read helper flip-flop sense amplifiers (HFF/SA) 426 0–N and a plurality of write drivers 423 0–N. Both read HFF/SA 426 0–N and write drivers 423 0–N are connected to digit lines D0–D0* to DN–DN* though a plurality of select transistors 420 0–N which are controlled by a control signal CSEL. Read HFF/SA 426 0–N output data to a plurality on output lines 431 0–N, which are connected to a plurality of read multiplexors (MUX) 428 0–N. Read MUX 428 0–N multiplex data from the Read HFF/SA 426 0–N and a redundant Read HFF/SA 426r, which is connected to the multiplexors by line 428r. The multiplexed data are outputted to a plurality of output lines 430 0–N. Write drivers 423 0–N receive data from a plurality of input lines 425 0–N, which are connected to a plurality of write multiplexors (MUX) 427 0–N. Write MUX 427 0–N receives data on lines 429 0–N and routes the data to write drivers 423 0–N via lines 425 0–N or redundant write driver 423r via line 425r. Write MUX 427 0–N and read MUX 428 0–N are connected to lines 442 0–N to receive signals SIT 0–N.

Figure 5:
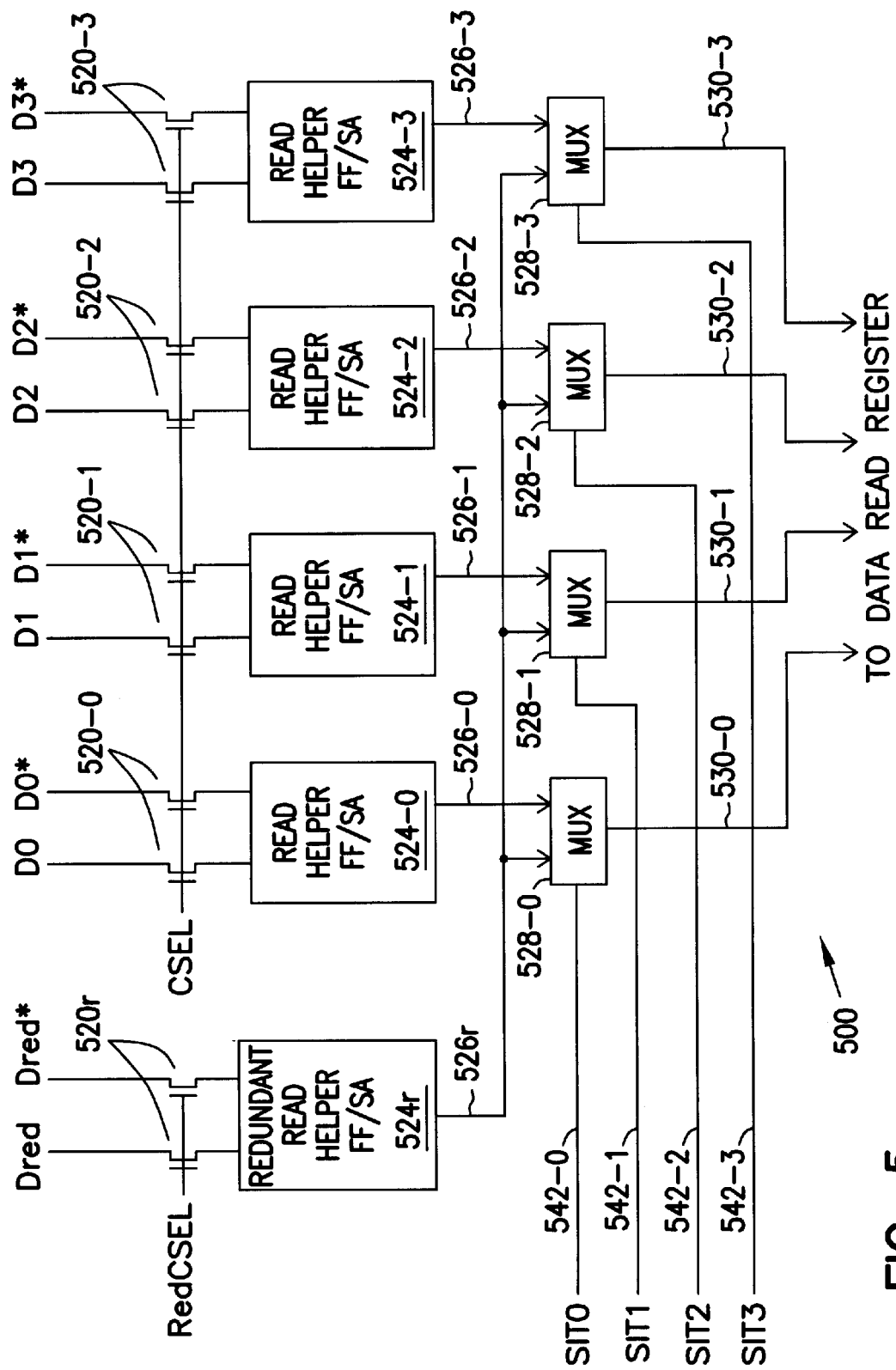
FIG. 5 is a block diagram of a read circuit of the read/write circuit and redundant read/write circuit of FIG. 4.

FIG. 5 is a block diagram of a read circuit 500 of the read/write circuit and redundant read/write circuit of FIG. 4. Read circuit 500 is a block diagram showing in more detail a read portion of read/write circuit 422 and a redundant read portion of redundant read/write circuit 424 of FIG. 4. Read circuit 500 includes a data read path having a plurality of Read HFF/SA 524 0–3 which are connected to a plurality of paired digit lines D0–D0* to D3–D3* through a plurality of select transistors 520 0–3. The select transistors are controlled by a control signal CSEL. Read HFF/SA 524 0–3 output data to a plurality of output lines 526 0–3 which are connected to a plurality of read multiplexors (MUX) 528 0–3. MUX 528 0–3 includes a plurality of output lines 530 0–3 connected to a data read register (shown in FIG. 1). Read circuit 500 also includes a redundant data read path including a redundant Read HFF/SA 526r connected to redundant paired digit lines Dred-Dred* through redundant select transistors 520r, which are controlled by a redundant column select signal RedCSEL. Redundant Read HFF/SA 526r is connected to MUX 528 0–3, which multiplex data from Read HFF/SA 524 0–3 and redundant Read HFF/SA 526r to the data register. In addition, read circuit 500 includes a plurality of select lines connected to the multiplexors 528 0–3.

Figure 6:
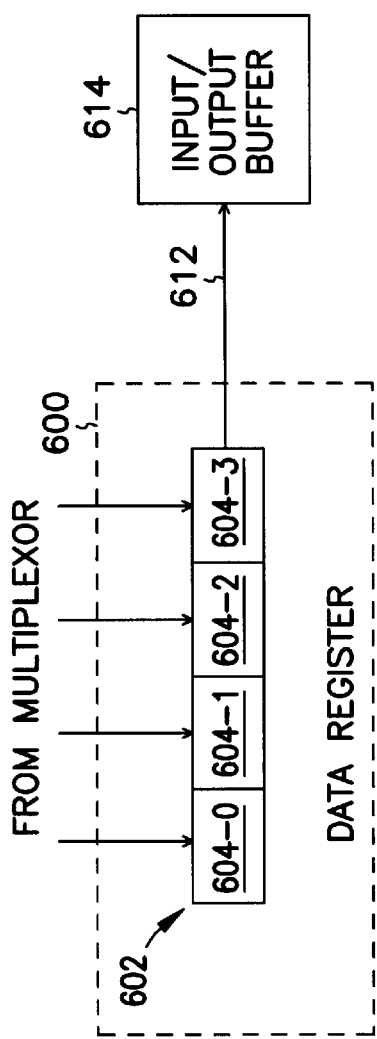
FIG. 6 shows one embodiment of a data read register of the memory device of FIG. 1.

FIG. 6 shows one embodiment of a data read register 600 of the memory device of FIG. 1. Data read register 600 includes a shift register 602 which has a plurality of register cells 604 0–3 for receiving data from MUX 528 0–3 of FIG. 5. Data from shift register 602 is shifted out serially on line 612 to an input/output buffer 614.

Figure 7:
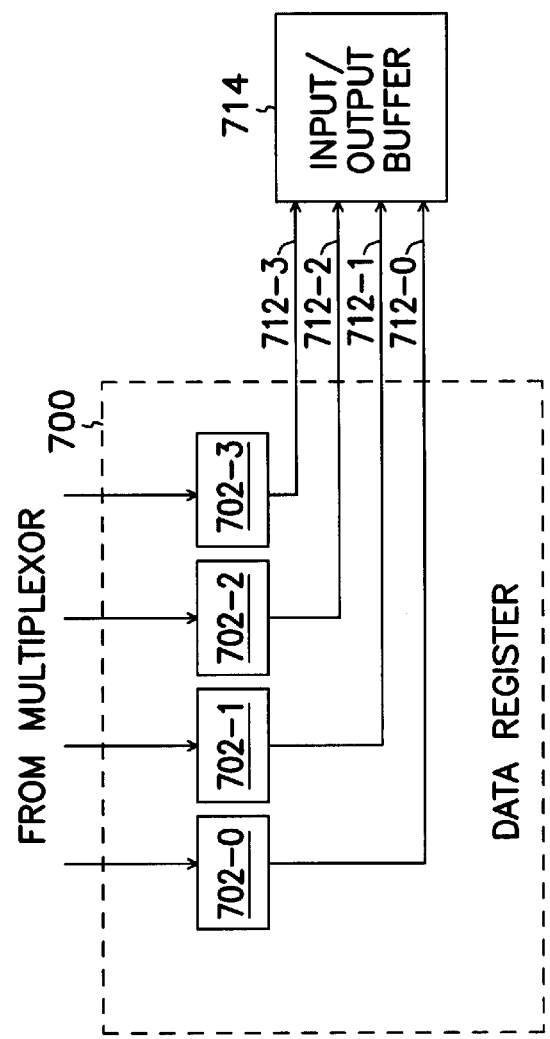
FIG. 7 shows another embodiment of a data read register of the memory device of FIG. 1.

FIG. 7 shows another embodiment of a data read register 700 of the memory device of FIG. 1. Data read register 700 includes a plurality of data latches 702 0–3 for receiving data from MUX 528 0–3 of FIG. 5. Unlike shift register 602 of FIG. 6, data latches 702 0–3 transmit data in a parallel via lines 712 0–3 to an input/output buffer 714.

In a read operation, referring to FIG. 5, Read HFF/SA 524 0–3 read data from a column of storage cells via paired digit lines D0–D0* to DN–DN* to MUX 528 0–3. Data from MUX 528 0–3 are output to data read register via lines 530 0–3. If the present address does not match the programmed address or a column of storage cells being accessed has no bad bit then all of select lines 542 0–3 have a low signal level which also means signal SIT 0–3 are not activated. Signal CSEL activates select transistors 520 0–3 to allow data or bits from the storage cells being accessed to be transmitted to Read HFF/SA 524 0–3 via paired digit lines D0–D0* to D3–D3*. The data then pass through lines 526 0–3 to MUX 528 0–3 and to the data read register. If the data register includes a shift register such as shift register 602 of FIG. 6 then the data are shifted serially to input/output buffer 614. If the data register includes a plurality of data latches such as data latches 702 0–3 of FIG. 7, then the data are transmitted in parallel to input/output buffer 714. If the present address matches the programmed address, then one of the SIT 0–3 has a high signal level on corresponding lines 542 0–3. This causes one of the MUX 528 0–3 connected to the corresponding lines 542 0–3 to multiplex the content of redundant read HFF/SA 524r in place of one of the content of the HFF/SA to the data read register. If the data register includes a shift register such as shift register 602 of FIG. 6 then the data are shifted serially to input/output buffer 614. If the data register includes a plurality of data latches such as data latches 702 0–3 of FIG. 7, then the data are transmitted in parallel to input/output buffer 714.

Figure 8:
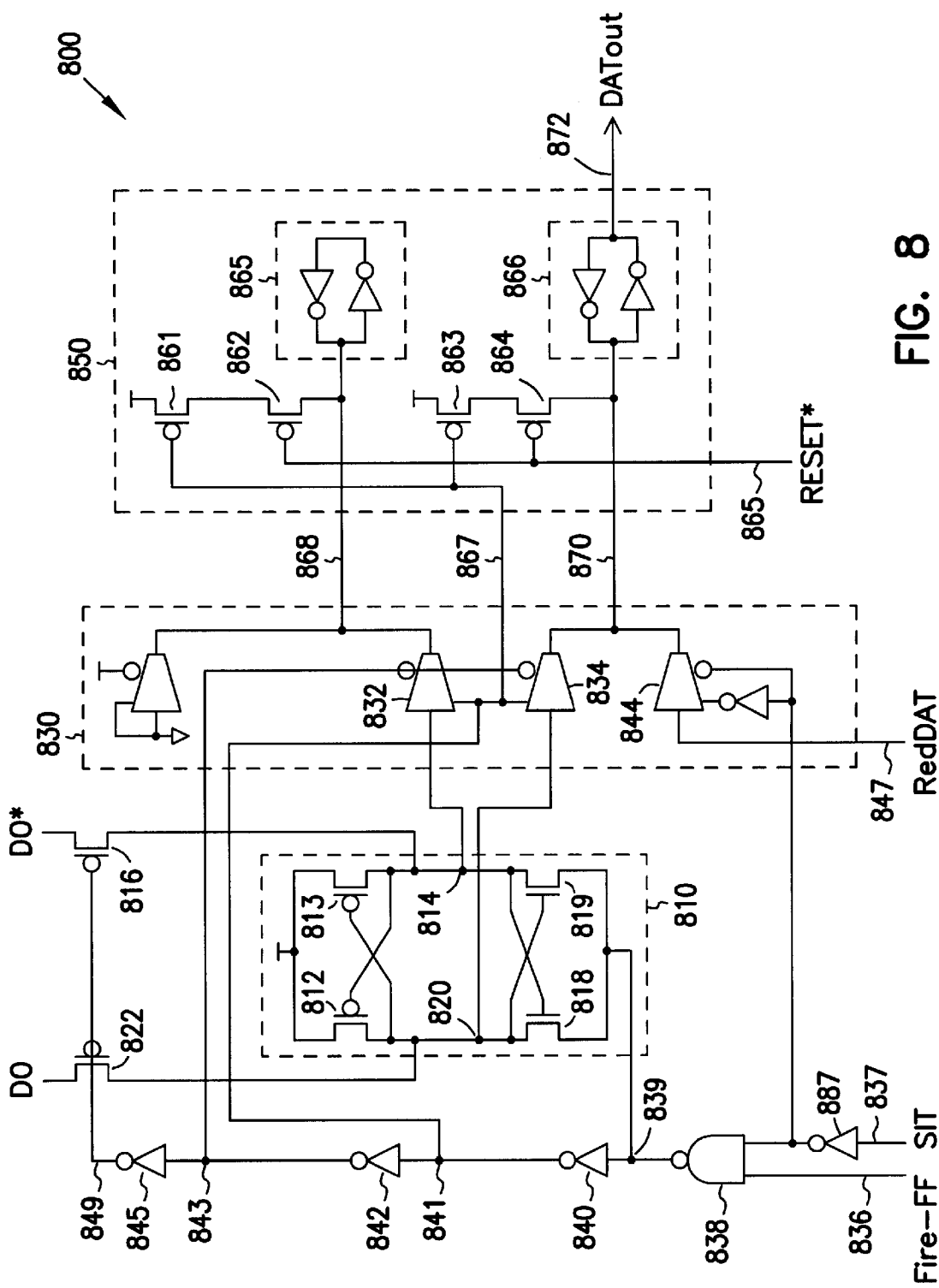
FIG. 8 is schematic diagram of a helper flip-flop and multiplexor circuit of the memory device of FIG. 1.

FIG. 8 is a schematic diagram of a Read HFF/SA and multiplexor (HFF/MUX) circuit 800. HFF/MUX Circuit 800 is essentially a schematic diagram of one of the Read HFF/SA 524 0–3 and one of the MUX 528 0–3 of FIG. 5. HFF/MUX Circuit 800 includes a flip-flop (FF) 810, a multiplexor (MUX) circuit 830, and a latch circuit 850. FF 810 includes cross-couple p-channel transistors 812 and 813 and cross-couple n-channel-transistors 818 and 819 having sense/output nodes 820 and 814 connected to digit lines D0 and D0* through p-channel transistors 816 and 822. Transistors 816 and 822 receive control signals from an output 849 of an inverter 845. FF 810 is connected to an output of a NAND gate 838 at node 839. NAND gate 838 has an input to receive signal Fire-HFF at node 836, and another input connected to receive an inverse of SIT signal from the output of an inverter 887. MUX circuit 830 includes transmission gates 832 and 834, which are connected to FF 810 at node 814 and 820, respectively. Transmission gates 832 and 834 are connected to receive control signals at nodes 841 and 843, which are parts of a path including NAND gate 838 and inverters 840 and 842. Transmission gate 844 is connected to receive the inverse of SIT signal at the output of inverter 887 to transmit a redundant data RedDAT at a node 847. Latch circuit 850 includes a plurality of reset transistors 861-4 connected to a first latch 865 and a second latch 866. Reset transistors 861 and 863 have their gates connected to a node 867. Reset transistors 862 and 864 have their gates connected to a node 865, which receive a latch-reset signal RESET. First latch 865 is connected to receive data from transmission gate 832 at a node 868. Second latch 866 is connected to receive data from either transmission gates 834 or 844 at a node 870. Data from second latch is output to data out node 872 (DATout).

In FIG. 8, SIT signal represents one of the SIT0–SIT3 shown in FIGS. 2a and 5. When SIT signal is activated or at a high signal level, it indicates that one of the SIT0–SIT3 signals of FIG. 5 is activated or at a high level signal which transmits the SIT information to one of the corresponding MUX 528 0–3 via lines 526 0–3 accordingly. For example, if the SIT information is 0 (first position), then SIT signal of FIG. 9 represents SIT0 of FIG. 5 and the SIT information is transmitted to MUX 528-0.

In operation, referring to FIG. 8, multiplexor circuit 830 multiplexes data from storage cells transmitted to FF 810 via paired digit lines D0–D0* and data from redundant cells, RedDAT at node 847. The multiplexed data is outputted to node 870 and consequently to output 872. During a read operation, a low signal level SIT at node 837 indicates a column having an address matching programmed address is not being accessed. Transmission gate 844 is not turned on because the inverse of SIT signal at the output of inverter 887 is high. Thus redundant data represented by signal RedDAT is not multiplexed or routed to latch 866 and output 872. Instead, storage data is routed to output 872 from multiplexor circuit 830. At a predetermined time during the read operation, signal Fire-HFF fires or transitions to high signal level. Since SIT is inverted to a high level signal, the output of NAND gate at node 839 is forced to a low signal level which effectively creates a virtual ground on node 839. A low signal level at node 839 forces the output 849 of inverter 845 to a high level signal which turns off transistors 816 and 822 separating paired digit lines D0–D0* from FF 810. At this time, the virtual ground turns FF 810 into a bistable latch which, before the transition of the fire-HFF signal, has a small potential difference on nodes 814 and 820 as a result of a small potential difference on D0 and D0* lines. The bistable latch amplifies difference in potential on nodes 814 and 820 to corresponding low and high level signals and sends them to transmission gates 832 and 834. Transmission gates 832 and 834 are controlled by signals at node 841 and 843. Since node 839 has a low signal level, node 841 is forced to a high level signal and node 843 is forced to a low level signal, which turn on both transmission gates 432 and 434 allowing data from FF 810 at nodes 814 and 820 to pass through the gates and to latches 865 and 866. Data from latch 866 is subsequently transferred to output 872.

A high signal level SIT at node 837 indicates a column having a bad bit is being addressed. A high signal level SIT forces a high signal level at node 839 which forces a low signal level at node 841 and a high signal level at node 834. Consequently, transmission gates are turned off preventing a passage from FF 810 to latches 865 and 866. In the mean time, a high level signal SIT turns on transmission gate 844 allowing redundant data RedDAT to pass through the gate and subsequently to output 872. In summary, when SIT at node 837 is high, it indicates a column having a bad bit is being addressed. Multiplexor 830 multiplexes redundant data RedDAT to output 872. When SIT at node 837 is low. Multiplexor 830 multiplexes storage data from paired digit lines D0–D0* to output 872.

Figure 9:
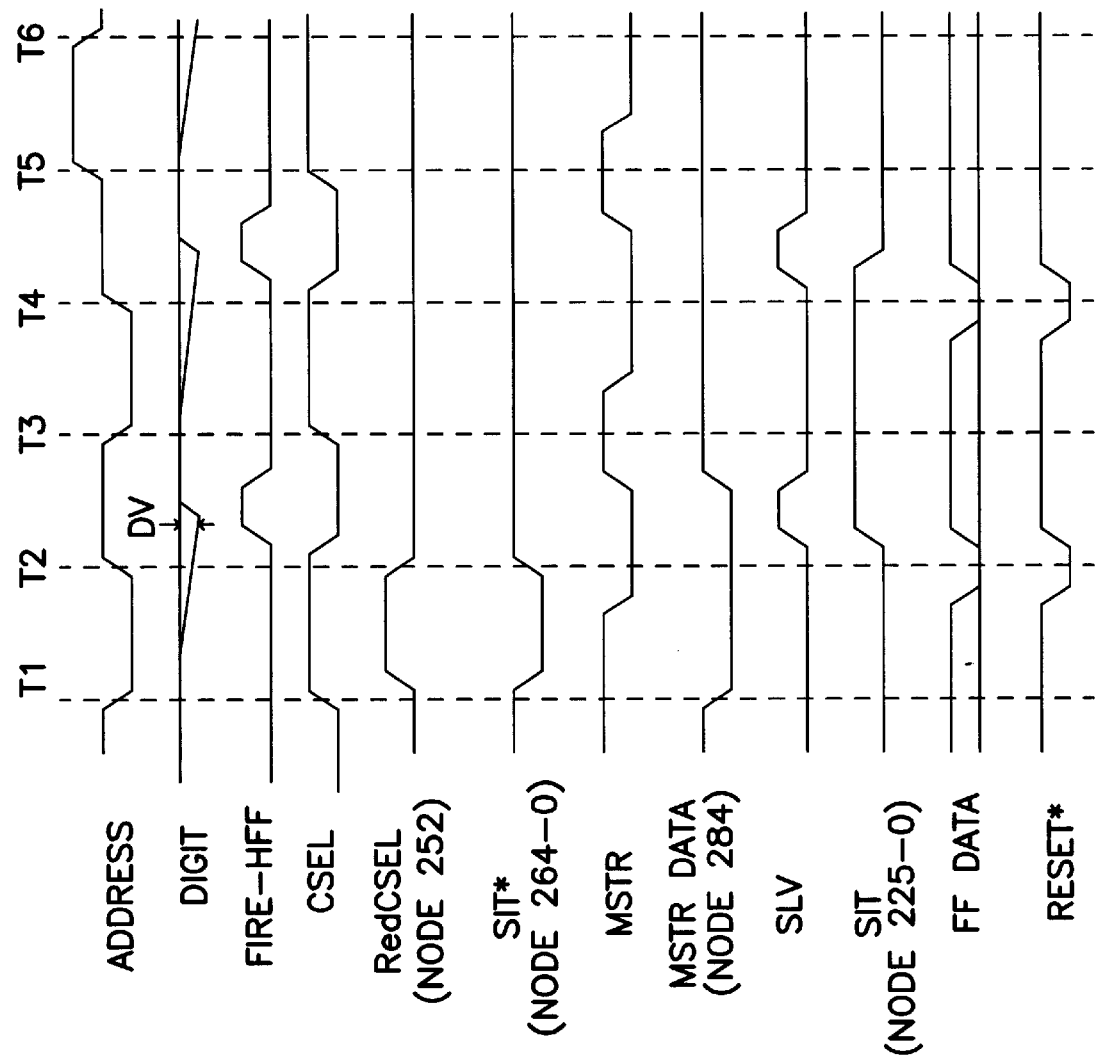
FIG. 9 is a timing diagram of the helper flip-flop and multiplexor circuit of FIG. 8 during a read operation.

FIG. 9 is a timing diagram of FHHMUX circuit 800 of FIG. 8 during a read operation. ADDRESS, RedCSEL, SIT*, MSTR, MSTR DATA, SLV and SIT were described in the description of FIG. 3. They are incorporated herein to illustrate how the SIT timing registers 202 0–3 of FIG. 2 utilize the SIT information and adjust its timing with the timing of HFF/MUX circuit 800 FIG. 8 during the read operation. At a time T1, CSEL signal transitions to a high signal level to access a column of memory cells. Data from the accessed cells are transmitted to paired digit lines D0 and D0* and to FF 810 at nodes 820 and 814. Data on paired digit lines are indicated in the Figure as DIGIT. A small potential difference between D0 and D0* is indicated as DV. At a certain time (after T2 and before T3), when DV reaches a certain potential, CSEL transitions to a low signal level and Fire-HEFF signal at node 836 fires or transitions to a high signal level. Notice that by the time Fire-HFF fires, SIT information (SIT* signal) is not valid (high level signal) but the valid SIT information was trapped at master latch. Trapped SIT information is indicated by MSTR DATA (still being at a low signal level). In other words, SIT* information is only valid when the address (ADDRESS) is valid, at this time FF 810 is not ready, therefore the SIT information must be trapped and wait for FF 810. When Fire-HFF, data from FF 810 at nodes 868 and 870 are transmitted to latches 865 and 866. The data of FF 810 is indicated as FF DATA in FIG. 9. When there is data the two lines are separated. To prepare the HFF/SA for the next cycle, the latch circuit 860 is reset. This reset function is performed by signal RESET* which transitions to a low signal level to turn on transistors 862 and 864 pulling FF DATA low before the next Fire-HFF fires.

Figure 10:
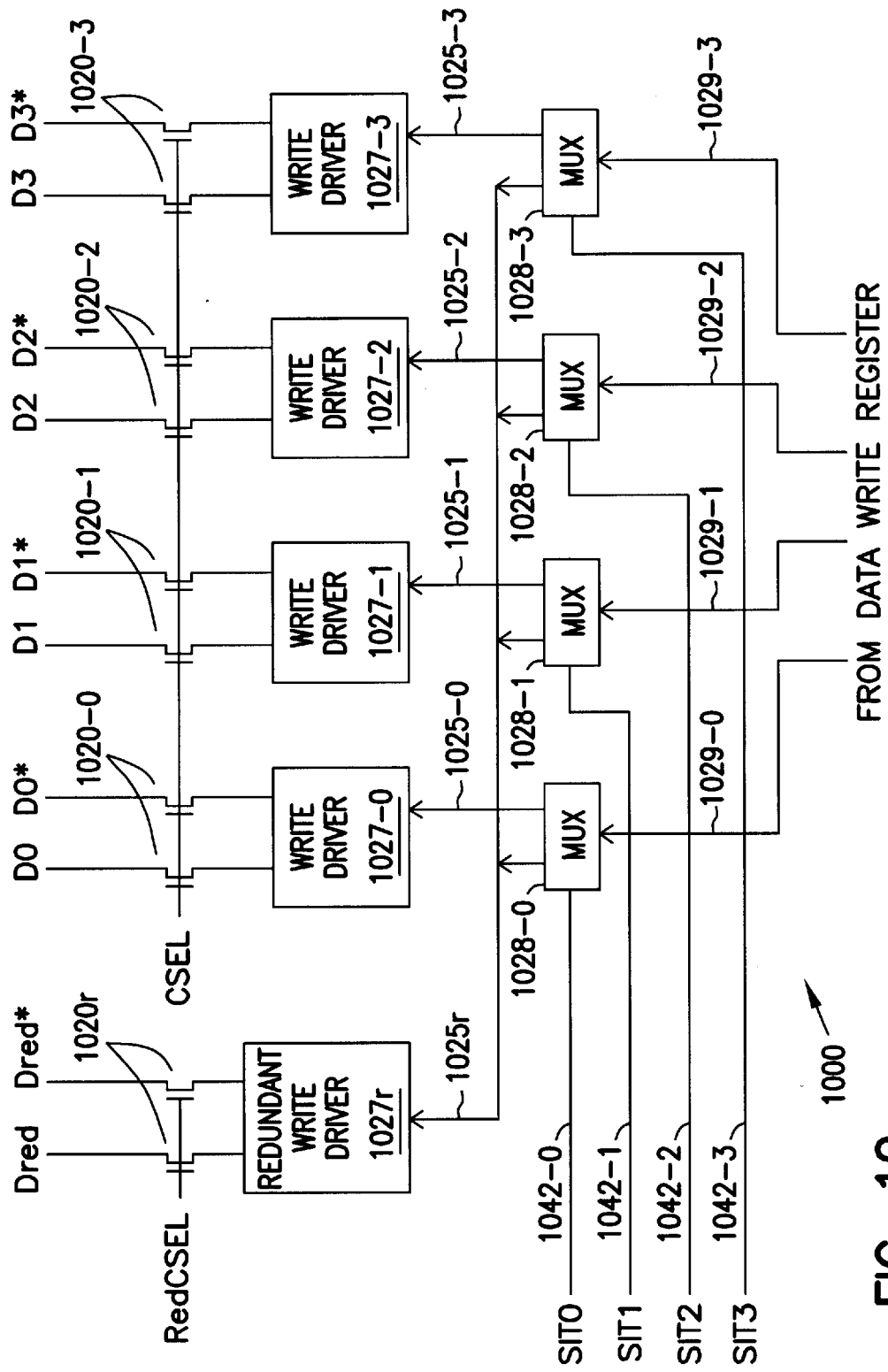
FIG. 10 is a block diagram of a write circuit of the read/write circuit and redundant read/write circuit of FIG. 4.

FIG. 10 is a block diagram of a write circuit 1000 and a read/write and redundant write circuit of the memory device of FIG. 4. Write circuit 1000 is a block diagram showing in more detail a write portion of read/write circuit 422 and redundant write portion of redundant read/write circuit 424 of FIG. 4. Write circuit 1000 includes a plurality of write drivers 1027 0–3 which are connected to a plurality of paired digit lines D0–D0* to D3–D3* through a plurality of select transistors 1020 0–3. The select transistors are controlled by a control signal CSEL. Write drivers 0–3 receive data from a plurality on input lines 1025 0–3 which are connected to a plurality of write multiplexors (MUX) 1028 0–3. Write MUX 1028 0–N receive data on lines 1029 0–N and route the data to write drivers 1027 0–N via lines 1025 0–N or a redundant write driver 1027r via line 1025r. Redundant write driver 1027r is connected to redundant paired digit lines Dred–Dred* through redundant select transistors 1020r, which are controlled by a redundant column select signal RedCSEL.

In a write operation, data are written into storage cells following a write path, which includes data write registers MUX 1028 0–3, write drivers 1027 0–3 and digit lines D0–DN*. In some cases, Data is also written into redundant cells following a redundant write path, which includes data write registers MUX 1028 0–3, redundant write drivers 1027r redundant digit lines Dred–Dred*. During the write operation, data from the data register are transmitted to MUX 1028 0–3 via lines 1029 0–3. If the present address of the column does not match the programmed address then the data are transmitted to write drivers 1027 0–3 and subsequently to the digit lines and storage cells. If the present address of the column matches the programmed address then only three of the four data bits from MUX 1028 0–3 are transmitted to three of write drivers 1024 0–3 and to the corresponding digit lines. The other one of the four data bits is rerouted to redundant write driver 1027r by one of the MUX 1028 0–3, which receives a SIT signal from one of the SIT 0–3 on lines 1042 0–3.

Figure 11:
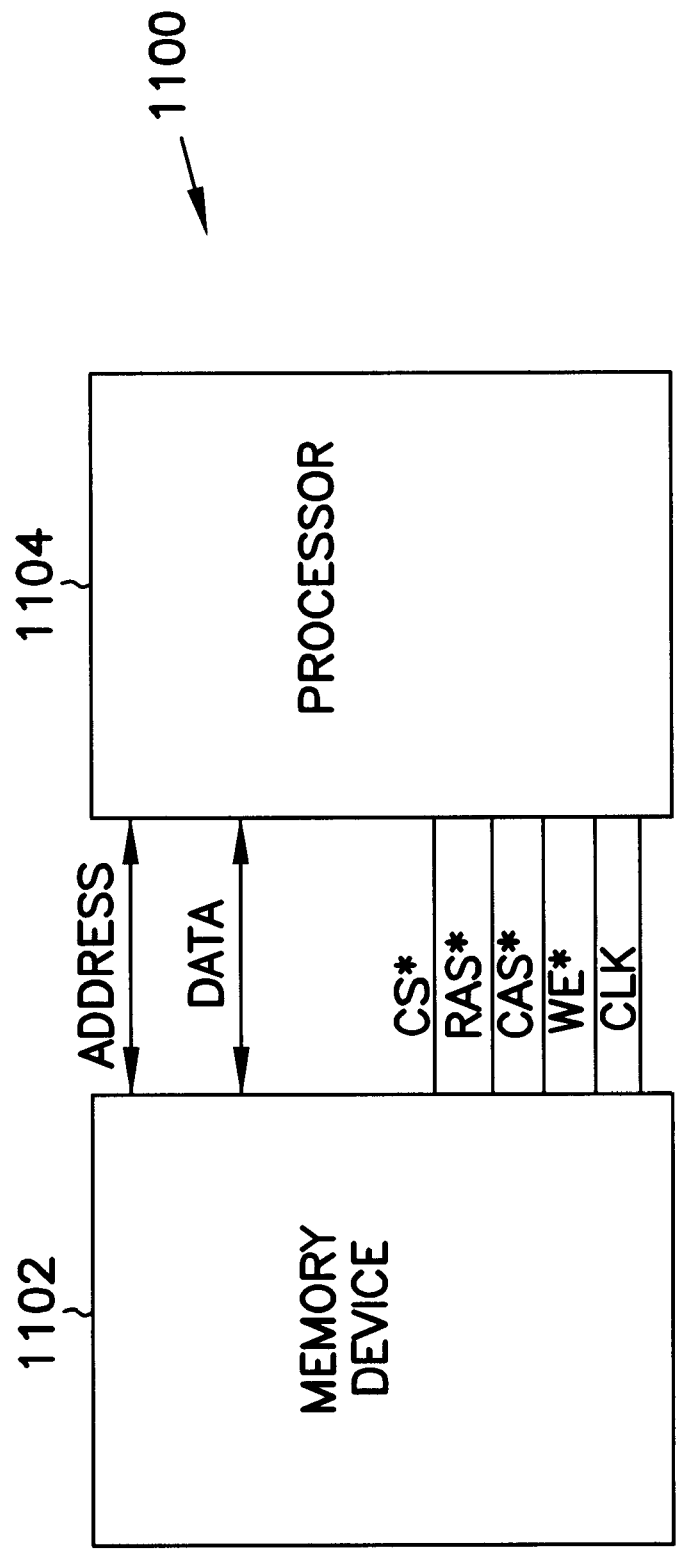
FIG. 11 is block diagram of a system according to the invention.

FIG. 11 is a block diagram of a system 1100 according to the invention. System 1100 includes a memory device 1102 connected to an external processor 1104. Memory device 1102 can be memory device 100 according to the invention as described above. Memory 1102 communicates with processor 1104 via an address bus (ADDRESS), a data bus DATA) and control signals which include, but are not limited to, a Chip Select (CS*), Row Access Strobe (RAS*), Column Access Strobe (CAS*), Write Enable (WE*), and Clock signal (CLK).

Although specific embodiments have been illustrated and described herein, it will be appreciated by those of ordinary skill in the art that any arrangement, which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. An integrated circuit comprising:
   a first set of programmable elements programmed to store an address of a column having a bad memory cell; and
   a second set of programmable elements programmed to store a segment-in-time (SIT) of the bad memory cell, the SIT of the bad memory cell indicating a relative position of the bad memory cell within a plurality of memory cells being accessed in a memory access.

2. The integrated circuit of claim 1 further comprising a match circuit connected to the first set of programmable elements, the match circuit producing a match signal when the column having the bad cell is accessed.

3. The integrated circuit of claim 1 further comprising a decode circuit connected to the second set of programmable elements, the decode circuit decoding a combination programmed in the second set of programmable elements and, upon receiving the match signal, producing a SIT signal indicating the SIT of the bad memory cell.

4. The integrated circuit of claim 1, wherein the first and second sets of programmable elements comprise antifuses.

5. The integrated circuit of claim 1, wherein the first and second sets of programmable elements comprise fuses.

6. An integrated circuit comprising:
   a fuse logic having a first and a second group of programmable elements, the first group of programmable elements programmed to store an address of a column having a bad memory cell, the second group of programmable elements programmed to store a segment-in-time (SIT) information of the bad memory cell, the SIT information indicating a relative position of the bad memory cell within a plurality of memory cells being accessed in a previous memory access,
   a SIT timing register connected to the fuse logic to receive the SIT information when the column having the bad cell is accessed, the SIT timing register holding the SIT information during a data transmission from the bad cell to a helper flip-flop sense amplifier (FF/SA) and releasing the SIT information after the data transmission to the helper FF/SA is completed.

7. The integrated circuit of claim 6 further comprising a match circuit connected to the first group of programmable elements, the match circuit producing a match signal when the column having the bad cell is accessed.

8. The integrated circuit of claim 6 further comprising a decode circuit connected to the second group of programmable elements, the decode circuit decoding a combination programmed in the second set of programmable elements and, upon receiving the match signal, producing a SIT signal indicating the SIT of the bad memory cell.

9. The integrated circuit of claim 6, wherein the first and second groups of programmable elements comprise antifuses.

10. The integrated circuit of claim 6, wherein the first and second groups of programmable elements comprise fuses.

11. The integrated circuit of claim 6, wherein the SIT timing register comprises a master latch to hold the SIT information and a slave latch to release the SIT information.

12. A memory device comprising:
storage cells and a redundant cell;
a plurality of helper flip-flop sense amplifiers (HFF/SA) connected to receive data the storage cells;
a redundant HFF/SA connected to receive data from the redundant cell;
a plurality of multiplexors connected to the HFF/SA and the redundant HFF/SA; and
a redundancy address match circuit connected to the multiplexors, the redundancy address match circuit having a plurality of SIT lines, each of the SIT lines is connected to a corresponding multiplexor, when one of the SIT lines transmits an SIT signal to the corresponding multiplexor, the corresponding multiplexor selects data from the redundant HFF/SA instead of data from the HFF/SA and outputs the data from redundant HFF/SA to an output of the corresponding multiplexor.

13. The memory device of claim 12, wherein the redundancy address match circuit further includes:
a first set of programmable elements programmed to store an address of a column having a bad memory cell; and
a second set of programmable elements programmed to store a segment-in-time (SIT) of the bad memory cell, the SIT of the bad memory cell indicating a relative position of the bad memory cell within a plurality of memory cells being accessed in a previous memory access.

14. A memory device comprising:
storage cells and redundant cells;
a read/write circuit connected to the storage cells;
a redundant read/write circuit connected to the redundant cells; and
a redundancy address match circuit connected to the read/write circuit and the redundant read/write circuit, the redundancy address match circuit comprising:
a first set of programmable elements programmed to store an address of a column having a bad memory cell; and
a second set of programmable elements programmed to store a segment-in-time (SIT) of the bad memory cell, the SIT of the bad memory cell indicating a relative position of the bad memory cell within a plurality of memory cells being accessed in a previous memory access.

15. The memory device of claim 14, wherein the memory further comprising a data read and a data write register connected to receive data from the read/write circuit.

16. The memory device of claim 15, wherein the data read register comprises a shift register, the shift register shifting data serially to an output buffer.

17. The memory device of claim 15, wherein the data read register comprises a plurality of data latches, the data latches shifting data in parallel to an output buffer.

18. The memory device of claim 14, wherein the redundancy address match circuit further includes a SIT timing register, the SIT timing register holding a SIT signal during a time before data from the storage cells arrives at the HFF/SA and transmitting the SIT signal to a multiplexor after the data from the storage cells arrives at the HFF/SA.

19. The memory device of claim 18, wherein the SIT timing register includes a master circuit to hold the SIT signal and a slave circuit to release the SIT signal.

20. A memory device comprising:
a read path including:
a plurality of digit lines connected to a column of storage cells;
a plurality of helper flip-flop sense amplifiers (HFF/SA) connected to the digit lines;
a plurality of multiplexors connected to the HFF/SA; and
a data read register connected to the multiplexors;
a redundant read path including:
a pair of redundant digit lines connected to a redundant cell;
a redundant helper flip-flop sense amplifier (HFF/SA) connected to the redundant digit lines;
a plurality of select lines connected to the multiplexors, wherein when the column is accessed and the column has a bad data bit from a storage cell, one of the select lines produces a segment-in-time (SIT) signal causing one of the multiplexors connecting to the HFF/SA which has the bad data bit to multiplex a data bit from the redundant HFF/SA instead of the bad data bit from one of the HFF/SA to the data read register.

21. The memory device of claim 20 further comprising a plurality of select transistors connected between the digit lines and the HFF/SA.

22. The memory device of claim 20 further comprising a plurality of redundant select transistors connected between the redundant digit lines and the redundant HFF/SA.

23. A memory device comprising:
storage cells and a redundant cell;
a plurality of write drivers connected to write data into the storage cells;
a redundant write driver connected to the redundant cell;
a plurality of multiplexors connected to the write drivers and the redundant write driver;
a data write register connected to the multiplexors; and
a redundancy address match circuit connected to the multiplexors, the redundancy address match circuit having a plurality of SIT lines, each of the SIT lines is connected to a corresponding multiplexor, when one of the SIT lines transmits an SIT signal to the corresponding multiplexor, the corresponding multiplexor routes data from the write data register to the redundant write driver.

24. The memory device of claim 23, wherein the redundancy address match circuit further includes:
a first set of programmable elements programmed to store an address of a column having a bad memory cell; and
a second set of programmable elements programmed to store a segment-in-time (SIT) of the bad memory cell, the SIT of the bad memory cell indicating a relative position of the bad memory cell within a plurality of memory cells being accessed in a previous memory access.

25. A system comprising:
a processor; and
a memory device connected to the processor, the memory device comprising:
storage cells and a redundant cell;
a plurality of helper flip-flop sense amplifiers (HFF/SA) connected to receive data the storage cells;
a redundant HFF/SA connected to receive data from the redundant cell;
a plurality of multiplexors connected to the HFF/SA and the redundant HFF/SA; and
a redundancy address match circuit connected to the multiplexors, the redundancy address match circuit having a plurality of SIT lines, each of the SIT lines is connected to a corresponding multiplexor, when one of the SIT lines transmits an SIT signal to the corresponding multiplexor, the corresponding multiplexor selects data from the redundant helper FF/SA instead of data from the helper FF/SA and outputs the data from redundant helper FF/SA to an output of the corresponding multiplexor.

26. A method of repairing a column of memory cells, the method comprising:

programming a first set of programmable elements to store an address of a column having a bad cell; and programming a second set of programmable elements to store a segment-in-time (SIT) information of the bad cell indicating a relative position of the bad memory cell within a plurality of memory cells being accessed in a memory access, decoding the SIT information to generate a SIT signal to replace the bad cell when the column having the bad cell is accessed.

27. The method of claim 26, wherein programming the first and second sets of programmable elements includes programming antifuses.

28. The method of claim 26, wherein programming the first and second sets of programmable elements includes programming fuses.

29. A method of reading a column of memory cells having a bad memory cell, the method comprising:

producing a segment-in-time (SIT) signal if an address of the column matches a programmed address during a memory access indicating the column has a bad cell;

transmitting data from the column of memory cells including data of the bad memory cell and data of a redundant cell to a plurality of multiplexors; and transmitting the SIT signal to one of the multiplexors to cause the multiplexor to route the data of the redundant cell instead of the data of the bad cell to a data register.

30. A method of writing a column of memory cells having a bad memory cell, the method comprising:

producing a segment-in-time (SIT) signal if an address of the column matches a programmed address during a memory access indicating the column has a bad cell;

transmitting data from a data register to a plurality of multiplexors;

transmitting the SIT signal to a corresponding multiplexors to cause the corresponding multiplexor to route data intended for the bad cell from the corresponding multiplexor to a redundant cell.

\* \* \* \* \*

UNITED STATES PATENT AND TRADEMARK OFFICE
CERTIFICATE OF CORRECTION

PATENT NO. : 6,301,164 B1  
DATED : October 9, 2001  
INVENTOR(S) : Troy A. Manning, Chris G. Martin, Shubneesh Batra and Donald M. Morgan It is certified that error appears in the above-identified patent and that said Letters Patent is hereby corrected as shown below:

Column 1,  
Line 27, insert -- , -- after "replaced".

Column 2,  
Line 30, insert -- , -- after "illustration".

Column 3,  
Line 50, delete "D0-5DN*" and insert -- D0-DN* --, therefor.

Column 4,  
Line 15, insert -- , -- after "Therefore".

Column 7,  
Lines 17 and 28, insert -- , -- after "FIG. 6".

Column 8,  
Line 17, insert -- , -- after "Thus".

Column 9,  
Line 44, delete "Data" and insert -- data --, therefor.  
Lines 50 and 53, insert -- , -- after "address".

Column 12,  
Line 59, insert -- from -- after "data".

Signed and Sealed this

Fourth Day of June, 2002

Attest:

Attesting Officer

JAMES E. ROGAN  
Director of the United States Patent and Trademark Office